United States Patent
Mancini et al.

(10) Patent No.: US 6,580,172 B2
(45) Date of Patent: Jun. 17, 2003

(54) LITHOGRAPHIC TEMPLATE AND METHOD OF FORMATION AND USE

(75) Inventors: David P. Mancini, Fountain Hills, AZ (US); Doug J. Resnick, Phoenix, AZ (US); William J. Dauksher, Mesa, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/103,608

(22) Filed: Mar. 21, 2002

(65) Prior Publication Data

US 2002/0122995 A1 Sep. 5, 2002

Related U.S. Application Data

(62) Division of application No. 09/797,558, filed on Mar. 2, 2001, now Pat. No. 6,387,787.

(51) Int. Cl.$^7$ ............................................. H01L 23/48
(52) U.S. Cl. ..................... 257/762; 257/776; 257/797; 257/798; 430/5; 430/311; 430/322; 430/323; 430/324
(58) Field of Search ................................. 257/762, 776, 257/797, 798; 430/5, 311, 322, 323, 324

(56) References Cited

U.S. PATENT DOCUMENTS

| | | | | |
|---|---|---|---|---|
| 4,837,123 A | * | 6/1989 | Kato et al. ................. | 430/269 |
| 5,308,741 A | * | 5/1994 | Kemp ......................... | 430/312 |
| 5,477,058 A | * | 12/1995 | Sato ............................ | 250/548 |
| 5,576,123 A | * | 11/1996 | Mohri et al. ................ | 430/5 |
| 5,876,878 A | * | 3/1999 | Pierrat et al. ............... | 430/5 |
| 5,882,827 A | * | 3/1999 | Nakao ......................... | 430/5 |
| 5,935,736 A | * | 8/1999 | Tzu ............................. | 430/5 |
| 6,096,459 A | * | 8/2000 | Yang ........................... | 430/5 |
| 6,190,929 B1 | | 2/2001 | Wang et al. | |
| 6,207,333 B1 | * | 3/2001 | Adair et al. ................. | 430/51 |
| 6,376,130 B1 | * | 4/2002 | Stanton ....................... | 430/5 |
| 6,376,131 B1 | * | 4/2002 | Cho et al. ................... | 430/5 |

* cited by examiner

Primary Examiner—Michael S. Lebentritt
Assistant Examiner—Douglas Menz
(74) Attorney, Agent, or Firm—William E. Koch

(57) ABSTRACT

The lithographic template is formed having a substrate, an optional etch stop layer formed on a surface of the substrate, and a patterning layer formed on a surface of the etch stop layer. The template is used in the fabrication of a semiconductor device for affecting a pattern in the device by positioning the template in close proximity to the semiconductor device having a radiation sensitive material formed thereon and applying a pressure to cause the radiation sensitive material to flow into the relief image present on the template. Radiation is then applied through the template so as to further cure portions of the radiation sensitive material and further define the pattern in the radiation sensitive material. The template is then removed to complete fabrication of the semiconductor device.

9 Claims, 2 Drawing Sheets

LITHOGRAPHIC TEMPLATE AND METHOD OF FORMATION AND USE

This is a division of application Ser. No. 09/797,558, filed Mar. 2, 2001, U.S. Pat. No. 6,387,787.

FIELD OF THE INVENTION

The present invention relates to semiconductor devices, microelectronic devices, micro electro mechanical devices, microfluidic devices, and more particularly to a lithographic template, a method of forming the lithographic template and a method for forming semiconductor devices with the lithographic template.

BACKGROUND OF THE INVENTION

The fabrication of integrated circuits involves the creation of several layers of materials that interact in some fashion. One or more of these layers may be patterned so various regions of the layer have different electrical characteristics, which may be interconnected within the layer or to other layers to create electrical components and circuits. These regions may be created by selectively introducing or removing various materials. The patterns that define such regions are often created by lithographic processes. For example, a layer of photoresist material is applied onto a layer overlying a wafer substrate. A photomask (containing clear and opaque areas) is used to selectively expose this photoresist material by a form of radiation, such as ultraviolet light, electrons, or x-rays. Either the photoresist material exposed to the radiation, or that not exposed to the radiation, is removed by the application of a developer. An etch may then be applied to the layer not protected by the remaining resist, and when the resist is removed, the layer overlying the substrate is patterned.

Lithographic processes such as that described above are typically used to transfer patterns from a photomask to a device. As feature sizes on semiconductor devices decrease into the submicron range, there is a need for new lithographic processes, or techniques, to pattern high-density semiconductor devices. Several new lithographic techniques which accomplish this need and have a basis in imprinting and stamping have been proposed. One in particular, Step and Flash Imprint Lithography (SFIL) has been shown to be capable of patterning lines as small as 60 nm.

SFIL templates are typically made by applying a layer of chrome, 80–100 nm thick, on to a transparent quartz plate. A resist layer is applied to the chrome and patterned using either an electron beam or optical exposure system. The resist is then placed in a developer to form patterns on the chrome layer. The resist is used as a mask to etch the chrome layer. The chrome then serves as a hard mask for the etching of the quartz plate. Finally, the chrome is removed, thereby forming a quartz template containing relief images in the quartz.

Overall, SFIL techniques benefit from their unique use of photochemistry, the use of ambient temperatures, and the low pressure required to carry out the SFIL process. During a typical SFIL process, a substrate is coated with an organic planarization layer, and brought into close proximity of a transparent SFIL template, typically comprised of quartz, containing a relief image and coated with a low surface energy material. An ultraviolet or deep ultraviolet sensitive photocurable organic solution is deposited between the template and the coated substrate. Using minimal pressure, the template is brought into contact with the substrate, and more particularly the photocurable organic layer. Next, the organic layer is cured, or crosslinked, at room temperature by illuminating through the template. The light source typically uses ultraviolet radiation. A range of wavelengths (150 nm–500 nm) is possible, however, depending upon the transmissive properties of the template and photosensitivity of the photocurable organic. The template is next separated from the substrate and the organic layer, leaving behind an organic replica of the template relief on the planarization layer. This pattern is then etched with a short halogen break-through, followed by an oxygen reactive ion etch (RIE) to form a high-resolution, high aspect-ratio feature in the organic layer and planarization layer.

The distinction between a lithographic mask and a lithographic template should be noted. A lithographic mask is used as a stencil to impart an aerial image of light into a photoresist material. A lithographic template has a relief image etched into its surface, creating a form or mold. A pattern is defined when a photocurable liquid flows into the relief image and is subsequently cured. The attributes necessary for masks and templates, therefore are quite different.

SFIL technology has been demonstrated to resolve features as small as 60 nm. As such, a wide variety of feature sizes may be drawn on a single wafer. Certain problems exist though with this SFIL template fabrication methodology as described above. In particular, problems exist with respect to uniform etching of the quartz template when only a chrome hard mask is utilized. It should be noted that etch depth on the template determines ultimately the thickness of the photocured resist layer on a wafer, and is very critical as a result. More specifically, the problem exists with respect to micro-loading effects on small features (<200 nm) in terms of etch uniformity. It is well know that small (<200 nm) features etch more slowly than larger features, resulting in a non-uniformity in both critical dimension and etch depth across the template. Due to micro-loading effects during the etch, small features will not etch completely, nor as deeply as large features. More specifically, the etch depth of sub-200 nm lines is shallower than for larger features. This results in a resist image which is non-uniform in thickness from large to small features. Because of this, three specific negative consequences result: (i) poor line width control; (ii) non-uniform etch depth (resulting in poor resist thickness uniformity); and (iii) rounded resist profiles.

In addition, there exist problems with the electron-beam writing of the template and the inspection of the template subsequent to fabrication. In particular, a conductive layer must be present, in order to avoid charge build-up during electron-beam exposure. In addition, inspectability is not readily achievable due to the template being comprised of a single material. Typical inspection systems use either light (ultraviolet or deep ultraviolet) or electrons to determine feature size and detect unwanted defects on the template. Light-based systems require a difference in reflection or index of refraction between patterned and unpatterned areas of the template to provide good image contrast. Likewise, an electron-based system requires a difference in atomic number between patterned and unpatterned areas of the template. To overcome this problem, multiple materials having either different optical properties or different atomic numbers would allow for inspection, a necessity for sub-100 nm features.

Accordingly, it would be beneficial to improve the etch uniformity of a template used in lithographic printing, with respect to both critical dimension and etch depth. In addition, it would be beneficial to provide for a template in which inspection for sub-micron structures is achievable.

It is a purpose of the present invention to provide for an improved lithographic template, a method of fabricating the improved lithographic template, and a method for making semiconductor devices with the improved lithographic template in which improvement in etch uniformity of the template, with respect to both critical dimension and etch depth is achieved.

It is yet another purpose of the present invention to provide for an improved lithographic template, a method of fabricating the improved lithographic template, and a method for making semiconductor devices with the improved lithographic template in which improvement in the inspection of sub-micron structures is achieved.

SUMMARY OF THE INVENTION

This invention relates to semiconductor devices, microelectronic devices, micro electro mechanical devices, microfluidic devices, and more particularly to a lithographic template, a method of forming the lithographic template and a method for forming devices with the lithographic template. Disclosed is a lithographic template including a substrate, an etch stop layer, and a patterning layer. The lithographic template is formed by providing a transparent substrate, forming an etch stop layer on the substrate, forming a patterning layer on the etch stop layer, forming a patterned resist layer on the patterning layer, etching the patterning layer to expose portions of the etch stop layer, and removing the patterned resist layer to expose the etched patterning layer, thus defining a lithographic template. Additionally, disclosed is a method for making a device with the lithographic template as provided, including the steps of providing a substrate, coating the substrate with a photocurable liquid, providing a lithographic template as previously disclosed, positioning the lithographic template in contact with the photocurable liquid, applying pressure to the template so that a pattern is created in the photocurable liquid, transmitting radiation through the lithographic template to expose at least a portion of the photocurable material on the substrate, thereby further affecting the pattern in the photocurable liquid, and removing the template from the substrate.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which.

Figure 1:
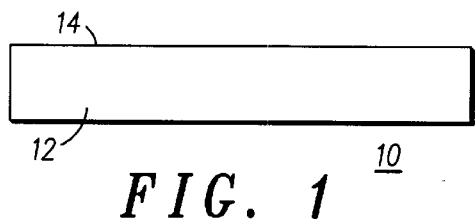
FIGS. 1–7 illustrate in cross-section views, process steps for fabricating a lithographic template in accordance with the present invention.

It will be appreciated that for simplicity and clarity of illustration, elements illustrated in the drawings have not necessarily been drawn to scale. For example, the dimensions of some of the elements are exaggerated relative to other elements for purposes of clarity. Furthermore, where considered appropriate, reference numerals have been repeated among the drawings to indicate corresponding or analogous elements.

DESCRIPTION OF THE PREFERRED EMBODIMENT

The present invention relates to the improvement of the etch uniformity of a template, with respect to both critical dimension and etch depth, and to improved inspection properties of a template. It is proposed that a bi-layer of materials be deposited on a substrate surface, thereby forming a lithographic template including these improvements. Referring to FIGS. 1–7, illustrated in cross-sectional views, are a plurality of process steps for fabricating a lithographic template according to the present invention. Referring more specifically to FIG. 1, illustrated is a first step in the process of fabricating a lithographic template 10 according to the present invention. More specifically, illustrated is substrate 12, having a surface 14. Substrate 12 is disclosed as being comprised of a transparent material, such as a quartz material, a polycarbonate material, a pyrex material, a calcium fluoride ($CaF_2$) material, a magnesium fluoride material ($MgF_2$), or any other similar type of material, that is transparent to light. Substrate 12 is formed of a transparent material to allow for the passage therethrough of light.

Figure 2:
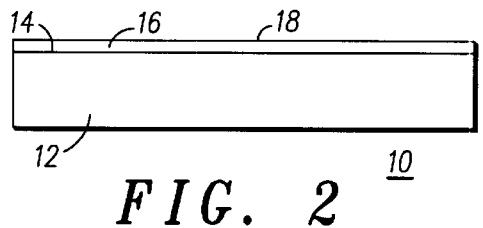

Referring now to FIG. 2, illustrated is substrate 12, having deposited thereon surface 14, an etch stop layer 16. Etch stop layer 16 is disclosed as being formed of either an opaque or transparent material, dependent upon overall design objective, and the deposition of subsequent layers. More specifically, it is disclosed that the specific type of material utilized will have bearing on the resulting process steps that must be undertaken to complete fabrication of template 10. Transparent materials that are disclosed as being suitable for the fabrication of etch stop layer 16 are chrome oxide ($Cr_x O_y$), aluminum oxide ($Al_x O_y$), aluminum nitride ($Al_x N_y$), chrome nitride ($Cr_x N_y$), indium-tin-oxide (ITO), indium oxide ($In_x O_y$), combinations of these material, or the like, where x and y are positive numbers with values that indicate the relevant concentration of an element in the aforementioned compounds. In a preferred embodiment x has a range of 1–1.0 and y has a range of 0.1–1.0. As an example, stoichiometric aluminum oxide is $Al_2O_3$. However, those skilled in the art realize that non-stoichiometric aluminum oxide films can be deposited and will serve the same purpose as the stoichiometric film. Opaque materials that are disclosed as being suitable for the fabrication of etch stop layer 16 are chrome (Cr), or the like. Etch stop layer 16 is formed to assist subsequent patterning of the remaining layers. Etch stop layer 16 is disclosed as having a thickness dependent upon the etch selectivity to the patterning layer, as well as the charge conductivity of the material used. Specifically, etch stop layer 16 will need to have a sufficiently low etch rate relative to the patterning layer in order to overcome any microloading effects. In addition, etch stop layer 16 must have sufficient strength to survive the stresses associated with template manufacturing and subsequent handling during the fabrication of the semiconductor devices with the completed lithographic template. Etch stop layer 16 is therefore generally disclosed as having a thickness in a range of 1–1000 nm, and a preferred thickness of at least 5 nm. Etch stop layer 16 is formed having a surface 18, on surface 14 of substrate 12 by spin coating, sputtering, vapor deposition, or the like.

Figure 3:
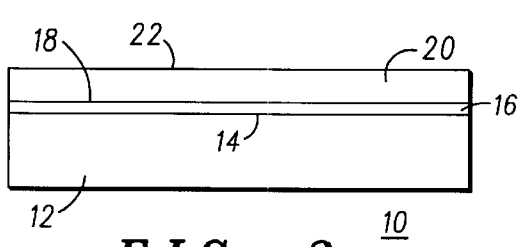

Referring now to FIG. 3, illustrated is substrate 12, having formed thereon etch stop layer 16. There is additionally formed on surface 18 of etch stop layer 16, a patterning layer 20. Patterning layer 20 is disclosed as being formed of either an opaque or transparent material, dependent upon overall design objective, as well as the material comprising etch stop layer 16. More specifically, it is disclosed that the specific type of material utilized will have bearing on the resulting process steps that must be undertaken to complete fabrication of template 10. Patterning layer 20 is generally disclosed as being formed of a material having a different reflectivity (or index of refraction) or different atomic number than the material used for etch stop layer 16. This difference in atomic number will provide for improved inspectability properties, as described presently. Transparent materials that are disclosed as being suitable for the fabrication of patterning layer 20 are silicon dioxide ($SiO_2$), silicon nitride (SiN), silicon oxy-nitride (SiON), indium-tin-oxide (ITO), or the like. Opaque materials that are disclosed as being suitable for the fabrication of patterning layer 20 are tungsten (W), tungsten silicide (WSi), tungsten silicon nitride (WSiN), tungsten alloys, tantalum (Ta), tantalum suicide (TaSi), tantalum silicon nitride (TaSiN), tantalum alloys, titanium (Ti), titanium alloys, molybdenum (Mo), molybdenum silicide (MoSi), molybdenum alloys, gold (Au), chrome (Cr), or the like. It should be noted that some patterning layers may not require an etch stop layer, since the substrate itself may perform sufficiently as an etch stop material. Patterning layer 20 may be used to assist charge dissipation during e-beam writing. In addition, patterning layer 20 aids in SEM-based template inspection due to the varying materials utilized in the plurality of layers. Patterning layer 20 is disclosed as generally having a thickness dependent upon the desired aspect ratio of the photocurable resist. Specifically, patterning layer 20 will need to have sufficient mechanical strength and durability to survive the stresses associated with template manufacturing and subsequent handling during the fabrication of the semiconductor devices with the completed lithographic template. Patterning layer 20 is therefore generally disclosed as having a thickness of between 10 and 5000 nm, and a preferred thickness of at least 50 nm. Patterning layer 20, having a surface 22, is formed on surface 18 of etch stop layer 16 by spin coating, sputtering, vapor deposition, or the like.

Figure 4:
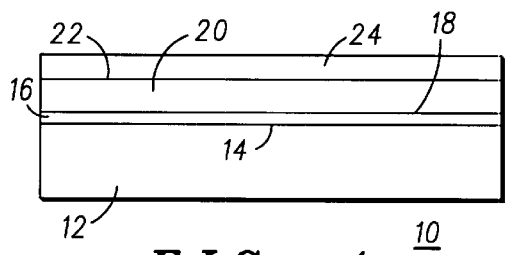
Figure 5:
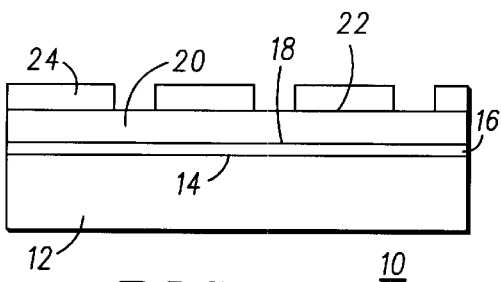

Referring now to FIGS. 4 and 5, illustrated is substrate 12, having formed thereon surface 14, etch stop layer 16 and patterning layer 20, formed on surface 18 of etch stop layer 16. Formed thereon surface 22 of patterning layer 20 is a resist layer 24, which is patterned as illustrated in FIG. 5 by standard optical or e-beam patterning techniques. Resist layer 24 is typically formed of a standard photoresist or electron-beam resist material well know in the art such as an organic polymer that is patterned so as to serve as a mask for the subsequent etching of patterning layer 20. It is additionally disclosed that anticipated by this disclosure is the optional inclusion of a hardmask layer (not shown), sandwiched between patterning layer 20 and resist layer 24. In the instance where a hard mask layer is included, it is anticipated that it would be formed of chrome (Cr), silicon dioxide ($SiO_2$), silicon oxy-nitride (SiON), silicon nitride (SiN), or the like.

Figure 6:
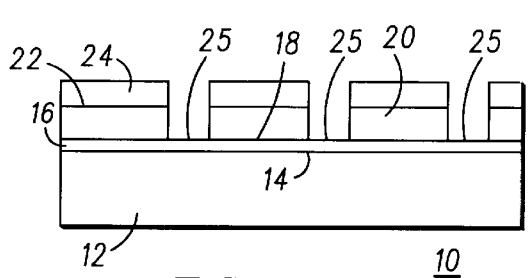

During fabrication, photoresist layer 24 serves as a mask for the etching therethrough of patterning layer 20. As illustrated in FIG. 6, patterning layer 20 is etched through to surface 18 of etch stop layer 16, thereby exposing portions 25 of etch stop layer 16. Etching of patterning layer 20 is accomplished through standard wet or dry etch techniques. Next, patterning layer 20 is overetched, if required, to provide for improved uniformity stopping against etch stop layer 16. Finally, to complete template 10, resist layer 24 is removed. In the instance where etch stop layer 16 is formed of an opaque material, removal of exposed portions 25 of etch stop layer 16 would need to be conducted to allow for the subsequent passage therethrough of radiation. Fabrication of template 10 in this manner to include an opaque etch stop layer 16 and patterning layer 20 provides for minimization of residual photopolymer where it is not desired, enhanced inspectability, compatibility with current template repair techniques, resistance to aggressive cleans, amorphous/low surface roughness material for desirable pattern transfer attributes and improved template contrast due to the varying material layers.

Figure 7:
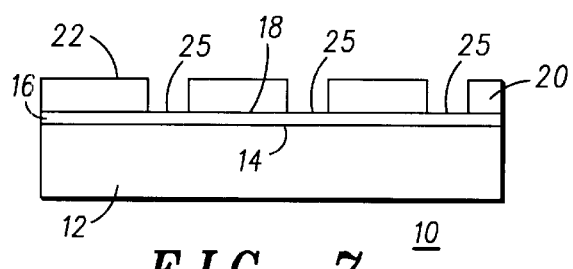

FIG. 7 illustrates in cross-sectional view, a completed lithographic template 10 including substrate 12 having surface 14, etch stop layer 16 overlying surface 14 of substrate 12, etch stop layer 16 having a surface 18, and patterning layer 20 overlying surface 18 of etch stop layer 16. Upon completion, template 10 defines therein a relief image 26.

Figure 8:
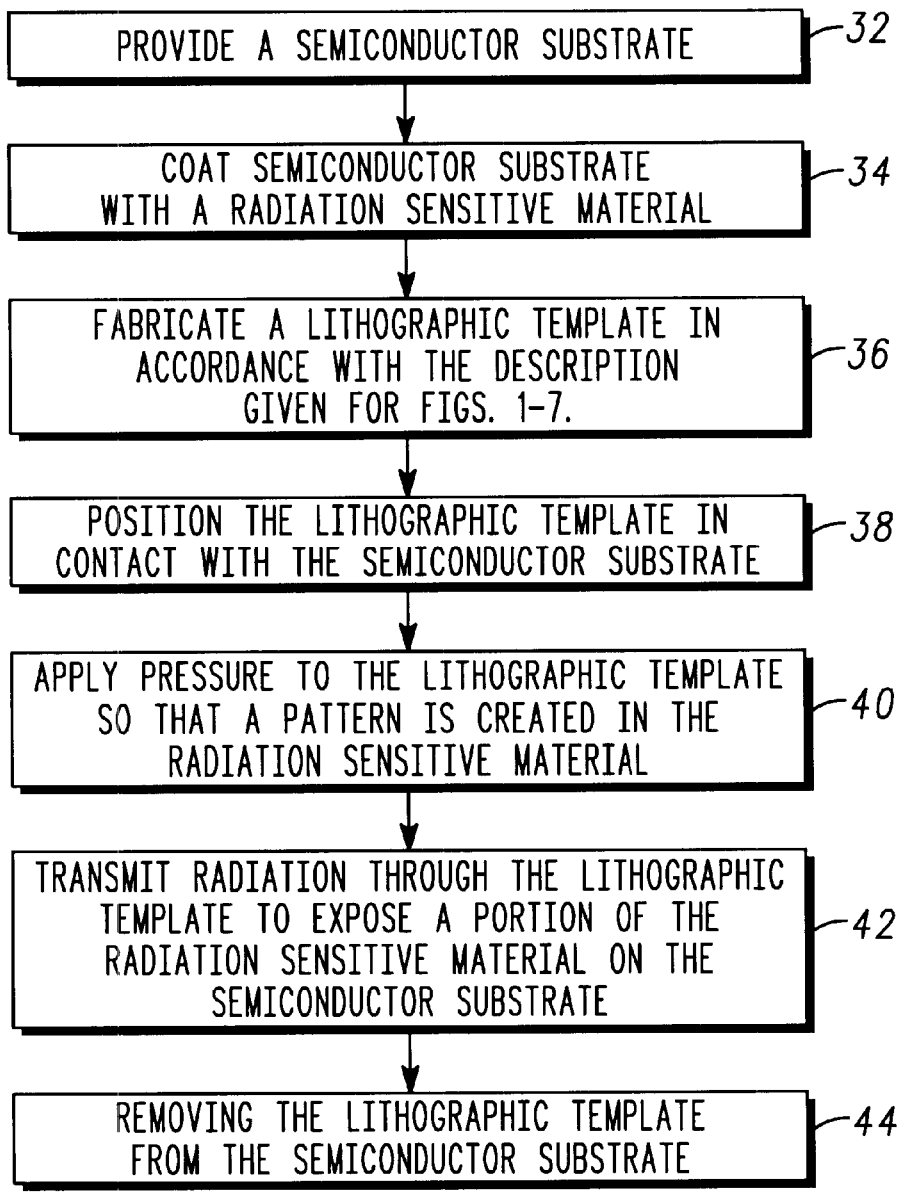
FIG. 8 is a simplified process flow diagram fabricating a semiconductor device with a lithographic template in accordance with the present invention.

Shown in FIG. 8 is a process flow diagram wherein a lithographic template, generally similar to template 10 of FIGS. 1–7, fabricated in accordance with the present invention is used to fabricate a semiconductor device 30. Initially, a semiconductor substrate 32 is provided. Semiconductor substrate is then coated 34 with a radiation sensitive material, such as a photocurable organic layer or a photoresist layer. The semiconductor substrate may have overlying devices or device layer such as polysilicon, oxide, metal, etc., as well as trench and diffusion regions or the like. A lithographic template is fabricated 36 in accordance with the description given for FIGS. 1–7. The radiation sensitive material layer coated semiconductor substrate is then placed adjacent 38 the lithographic template. A slight pressure is applied 40 to the template so that the radiation sensitive material layer flows into the relief images on the template. Radiation is then transmitted 42 through the lithographic template, including the substrate, the etch stop layer and the patterning layer (for the cases when the patterning layer is transparent), and imaged onto the radiation sensitive material layer coated semiconductor substrate to further define and expose a pattern in the radiation sensitive material layer. The template is thereafter removed 44 from the semiconductor device, thereby leaving a patterned organic layer which is then used as an image layer for subsequent processing. The photoresist layer can then be used as a mask, either in conjunction with ion implantation to form implanted regions in the semiconductor substrate, or can be used in conjunction with conventional wet or dry etches to transfer the pattern into the semiconductor substrate, or into device layers overlying the semiconductor substrate. It should be understood that although the template fabricated in accordance with the present invention is described in the preferred embodiment as being used to fabricate a semiconductor device, that anticipated is the use of a template, generally similar to template 10 of FIG. 7, to form microelectronic devices, micro electro mechanical devices, and microfluidic devices.

The foregoing description and illustrations contained herein demonstrate many of the advantages associated with the present invention. In particular, the present invention provides for improvement of etch uniformity of a template used in lithographic printing, with respect to both critical dimension and etch depth. In addition, the method of fabricating the template and template structure according to the present invention provide for a template in which inspection for sub-micron structures is achievable.

Thus it is apparent that there has been provided, in accordance with the invention, a lithographic template, and a method of its formation and use that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. Therefore, it is intended that this invention encompass all such variations and modifications as fall within the scope of the appended claims.

We claim:

1. A lithographic template comprising:

a substrate having a surface and formed of a material;

an etch stop layer formed on the surface of the substrate and formed of a second material, different than the first material; and a patterning layer formed on an uppermost surface of the etch stop layer, the patterning layer having defined therein a relief image.

2. A lithographic template as claimed in claim 1, wherein the first material is one of a quartz material, a polycarbonate material, a calcium fluoride ($CaF_2$) material, a magnesium fluoride ($MgF_2$) material, or a pyrex material.

3. A lithographic template as claimed in claim 1, wherein the etch stop layer is one of an opaque material or a transparent material.

4. A lithographic template as claimed in claim 3, wherein the opaque material is chrome (Cr).

5. A lithographic template as claimed in claim 3, wherein the transparent material is at least one of chrome oxide ($Cr_xO_y$), aluminum oxide ($Al_xO_y$), aluminum nitride ($Al_xN_y$), chrome nitride ($Cr_xN_y$), indium-tin-oxide (ITO), and indium oxide ($In_xO_y$).

6. A lithographic template as claimed in claim 5 wherein x has a range of 0.1–1.0 and y has a range of 0.1–1.0.

7. A lithographic template as claimed in claim 1, wherein the patterning layer, formed of a second material different than the first material, is formed of one of an opaque material or a transparent material.

8. A lithographic template as claimed in claim 7, wherein the opaque material is one of tungsten (W), tungsten silicide (WSi), tungsten silicon nitride (WSiN), tantalum (Ta), tantalum alloys, tungsten alloys, gold (Au), chrome (Cr), tantalum silicide (TaSi), titanium (Ti), titanium alloys, molybdenum (Mo), molybdenum silicide (MoSi), molybdenum alloys, or tantalum silicon nitride (TaSiN).

9. A lithographic template as claimed in claim 7, wherein the transparent material is one of silicon dioxide ($SiO_2$), silicon nitride (SiN), indium-tin-oxide (ITO), or silicon oxy-nitride (SiON).

* * * * *